United States Patent [19]

Corda

[11] Patent Number: 5,134,508

[45] Date of Patent: Jul. 28, 1992

[54] OPTICAL HIGH-SPEED PARALLEL BACKPLANE

[75] Inventor: Albert J. Corda, Dahlgren, Va.

[73] Assignee: The United States of America as represented by the Secretary of the Navy, Washington, D.C.

[21] Appl. No.: 471,316

[22] Filed: Jan. 29, 1990

[51] Int. Cl.$^5$ .......................... G02F 1/00; H04B 10/00
[52] U.S. Cl. ..................................... 359/109; 359/152
[58] Field of Search ............... 455/600, 602, 606, 607, 455/609, 611, 612, 613, 617; 370/2, 3; 359/152, 154, 117, 109; 250/227.11, 239; 385/14, 46; 307/311

[56] References Cited

U.S. PATENT DOCUMENTS

| | | | |
|---|---|---|---|
| 4,195,269 | 3/1980 | Ettenberg | 455/612 |
| 4,358,858 | 11/1982 | Tamura | 455/607 |
| 4,612,670 | 9/1986 | Henderon | 455/602 |
| 4,892,376 | 1/1990 | Whitehouse | 359/154 |
| 5,008,554 | 4/1991 | Asakawa et al. | 250/227.11 |

FOREIGN PATENT DOCUMENTS 2201561 9/1988 United Kingdom ............... 455/612

*Primary Examiner*—Edward L. Coles, Sr.
*Assistant Examiner*—Kinfe-Michael Neltash
*Attorney, Agent, or Firm*—John D. Lewis; Kenneth E. Walden

[57] ABSTRACT

An optical backplane for use in a high-speed, parallel signal processing system. A plurality of circularly shaped optical conductors are arranged in a cylindrical topology. A plurality of printed circuit card connectors are disposed radially about the perimeter of the optical conductors. Each connector consists of a linear array of optical transceivers. The lens of each optical transceiver is mounted in a socket provided at the perimeter of each optical conductor. The optical transceivers convert electrical data information from printed circuit boards plugged into the circuit card connectors into optical data information. The optical data information propagates throughout the optical conductor thereby allowing data to be shared by the printed circuit boards.

20 Claims, 2 Drawing Sheets

OPTICAL HIGH-SPEED PARALLEL BACKPLANE

ORIGIN OF THE INVENTION

The invention described herein was made in the performance of official duties by an employee of the Department Of the Navy and may be manufactured, used, licensed by or for the Government for any governmental purpose without payment of any royalties thereon.

BACKGROUND OF THE INVENTION

1. Field of the Invention

This invention relates to high-speed data processing in particular to an optical high-speed parallel backplane for interconnecting a plurality of printed circuit boards in a parallel signal processing system.

2. Description of the Prior Art

The conventional approach to parallel backplane design utilizes a set of card-edge connectors mounted on a flat supporting structure typically made of phenolic glassepoxy. Common bus pins are interconnected via a set of linear metallized traces deposited on the supporting structure. Although this technique is acceptable for systems supporting low bandwidth applications, it begins to fail as the bus bandwidth exceeds 15 MHz. Of all the physical parameters which affect bus bandwidth, signal path length is the most crucial. According to the law of electromagnetics, when signal path length approaches a quarter wavelength of operating frequency, radiative losses occur. This not only distorts the wave form present on the signal path, but also increases coupling between adjacent signal path elements, such as the linear traces on conventional backplane. Thus, as the bus bandwidth increases the linear parallel traces become inductively coupled and even begin to act as radiating elements thereby introducing cross-talk.

Current bus designs use a variety of mechanical shielding approaches and electrical termination schemes in an attempt to rectify the problem, but small changes in operating frequency and/or number of supported interconnects can often change the characteristic impedance of the system. Other conventional designs try to prevent the quarter wavelength effect by alternating signal and ground paths to shield the adjacent signal lines from one another. While these and other approaches have met with limited success, they all leave the basic problem of the quarter wavelength limit unsolved. Moreover, due to increasing needs of the business, industry and scientific communities for real-time signal processing and data analysis, the speed at which data can be processed will be critical in system design. However, the present day electromagnetic parallel backplane structures which are currently incorporated in these designs will be stretched to the limit of their capabilities in attempting to handle the increased time restrictions and bus loads placed upon them.

An application entitled "High Speed Parallel Backplane" filed by Applicant on 29 Jan. 1990 is relevant in that a novel circularly clasped backplane is disclosed. While the circular shape addresses some of the same problems associated with transmission speed, no suggestions in the earlier application are made concerning the optical structure herein disclosed.

SUMMARY OF THE INVENTION

Accordingly, it is an object of the present invention to provide a parallel backplane capable of handling high speed data processing across a broad bus bandwidth.

It is a further object of the present invention to provide a parallel backplane that minimizes cross-talk between data signal paths.

Still another object of the present invention is to provide a parallel backplane whose physical construction is practical for various applications.

Yet another object of the present invention is to provide a parallel backplane for real-time signal processing.

Other objects and advantages of this invention will become more apparent hereinafter in the specifications and drawings.

In accordance with the invention, an optical high-speed parallel backplane has been designed to provide a common signal bus for a plurality of printed circuit boards in a high-speed parallel signal processing system. A plurality of circular optical conductors are arranged to form a cylindrical topology. A plurality of circuit card connectors are disposed radially about the perimeter of the optical conductors. The circuit card connectors connect the printed circuit boards to optical transceivers housed in the circuit card connectors. Each of the optical conductors is an optically transparent material coated on its top and bottom surfaces with an opaque paint. Sockets are provided radially around the outer edge of each optical conductor for the mounting of the optical transceivers. The transceivers convert electrical data information from the printed circuit boards to optical data information and visa versa. The optical data information propagates throughout the optical conductor thereby allowing data to be shared by the printed circuit boards.

DETAILED DESCRIPTION OF THE INVENTION

Figure 1:
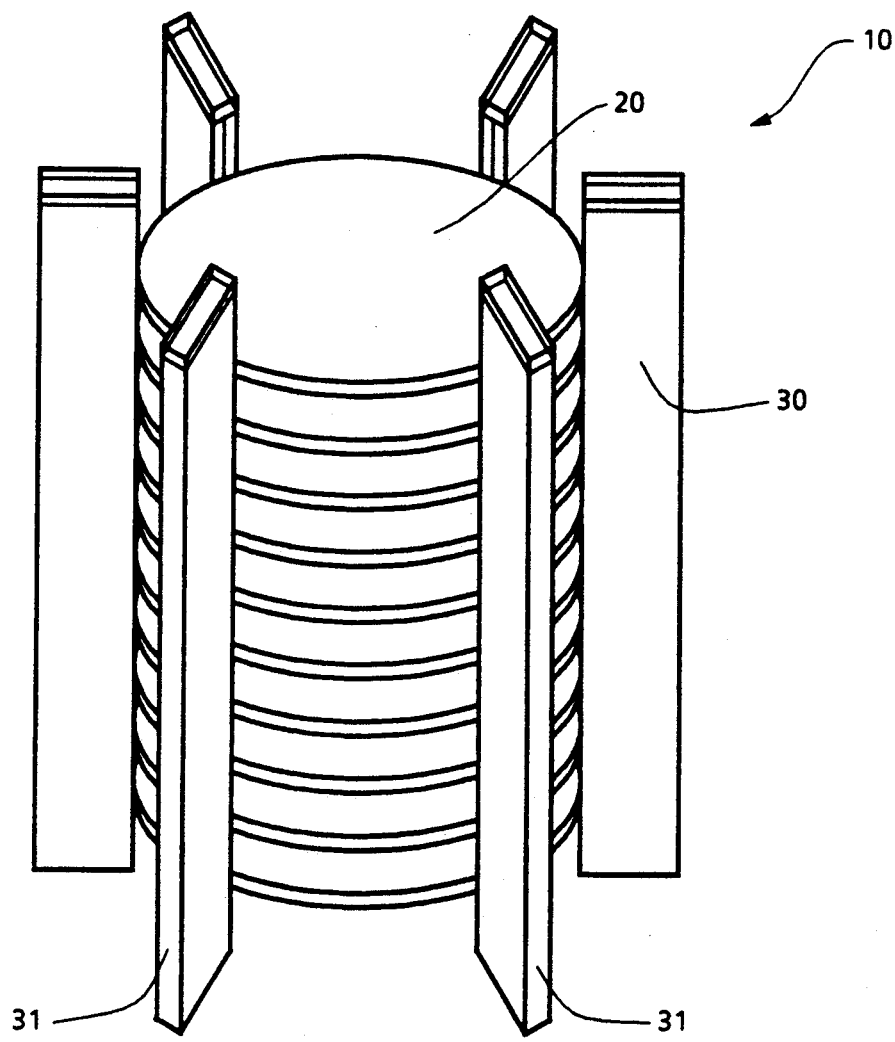
FIG. 1 is a prospective view of the preferred embodiment of the optical high-speed parallel backplane according to the present invention.

Referring to the drawings, and in particular to FIG. 1, the optical high-speed parallel backplane 10 according to the present invention is shown. A series of circularly shaped, optical conductors 20 are stacked to create a cylindrical set of conductors. Optical conductors 20 are shown parallel to one another in FIG. 1. for purposes of description only. However, optical conductors 20 need not be parallel to one another since the optically based transmission system of the present invention totally eliminates inductive and capacitive effects which can prove so troublesome in conventional electromagnetic designs. For the same reasons, optical conductors 20 may be stacked on top of each other thereby reducing space requirements.

Figure 2:
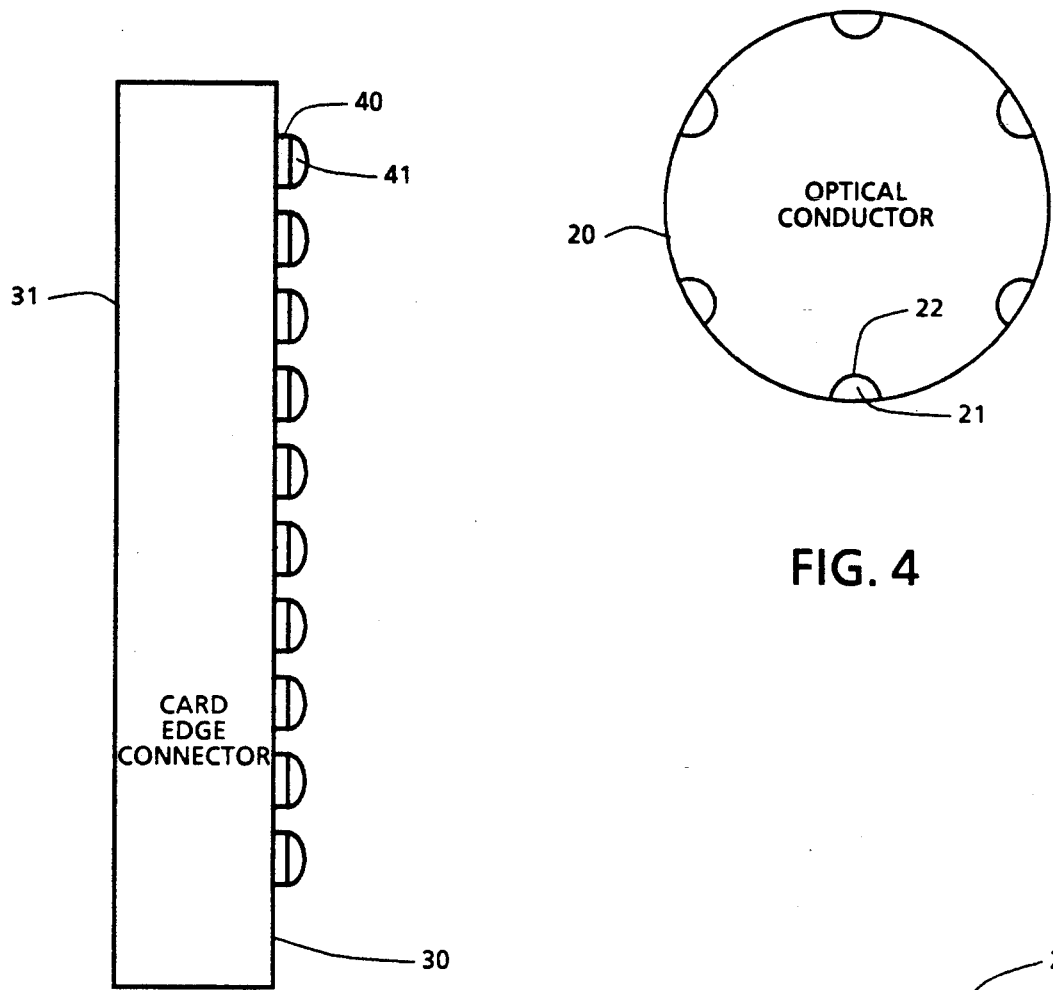
FIG. 2 a side-view of one of the circuit card connectors used in the optical high-speed parallel backplane.

Card-edge connectors 30 are arranged radially around the perimeter of the optical conductors 20. A side-view of one of the card-edge connectors 30 is shown in FIG. 2. Each of the card-edge conductors 30 consists of a linear array of optical transceivers 40 to be used as both emitters and detectors. Each transceiver 40 has a lens 41 that extends outward from connector 30. Connective pads on conventional, off-the-shelf printed circuit boards (not shown) are plugged into each of the card-edge connectors 30 at the front 31 of each connector 30 to electrically connect the printed circuit boards to the optical transceivers 40.

Figure 3:
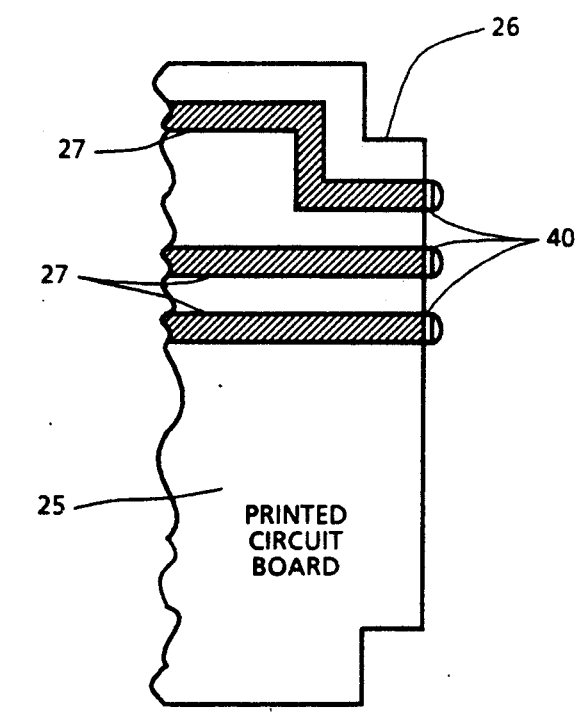
FIG. 3 is a front-view of an alternative mounting configuration for the optical transceivers.

Alternatively, the linear array of optical transceivers 40 may be mounted directly on the printed circuit board as shown in FIG. 3. The transceivers 40 are mounted on the edge 26 of a printed circuit board 25. Electrical connection to the circuit board 25 is accomplished via the linear metallized traces 27. This approach has the advantage of keeping failure prone components off the actual bus structure.

The 6-card parallel backplane structure of FIG. 1 is shown for purposes of description only. The optical parallel backplane of the present invention may be designed for any number of cards depending upon system requirements and limitations.

Figure 5:
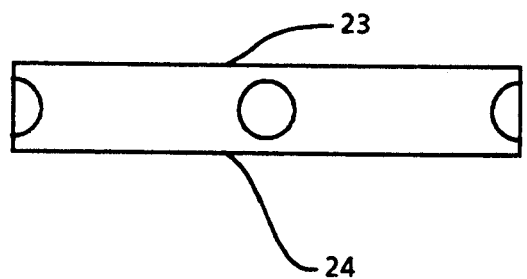
FIG. 5 is a side-view of the optical conductor shown in FIG. 3.
Figure 4:
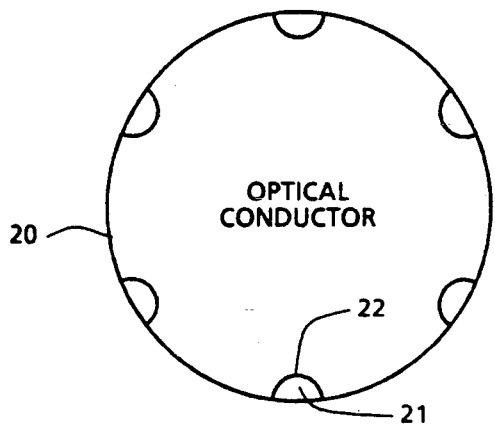
FIG. 4 is a cross-sectional view from above one of the optical conductors used in the present invention.

A cross-sectional view from above and a side-view of one optical conductor 20 is shown in FIGS. 4 and 5, respectively. Conductor 20 is made of any optically transparent material such as plexiglass. A set of holes or sockets 21 are drilled radially around the perimeter of conductor 20. The interior surface 22 of each socket 21 has a ground glass finish to provide for even optical propagation by diffusing light throughout conductor 20. The diameter of socket 21 is such that it can accommodate the lens portion 41 of optical transceiver 40 mounted in each socket 21.

The number of sockets 21 needed per conductor 20 and the radius of conductor 20 are dictated by the number of card-edge connectors 30 desired for the geometry of the conductor 20. Typically, for the 6 card-edge connectors shown in FIG. 3, conductor 20 is only 2.5 cm in diameter and 0.64 cm in thickness. This size is based upon the diameter of currently available optical emitters and detectors. The thickness of conductor 20 could be reduced by using a transceiver 40 having a smaller lens diameter.

The top and bottom surfaces 23 and 24, respectively, of each conductor 20 consist of a material which is impervious to light such as an opaque paint. In this way, each conductor 20 is optically responsive to optical data information generated only by its respective optical transceivers 40. Thus, the optically based transmission system of the present invention is free from cross-talk problems inherent in electromagnetic backplane systems.

Each optical transceiver 40 mounted in a socket 21 must be capable of transmitting and receiving optical data information. In operation, electrical data information from the printed circuit boards is converted to optical data information by a transceiver 40. The optical data information in the form of light propagates throughout conductor 20 where the optical data information can be shared by any other printed circuit boards connected to the respective conductor 20 via a transceiver 40.

Typically, transceiver 40 may be a single element light emitting diode (LED) emitter/detector. Alternatively, transceiver 40 may use a separate emitter and a separate detector. Frequency selective or polarized emitters and detectors may also be used to allow for multiple signal paths within a conductor 20.

The advantages of the present invention are numerous. The optically based transmission system of the present invention does not suffer from the drawbacks of conventional electromagnetic backplanes. Since it is not subject to the quarter wavelength limit, the present invention is capable of handling high-speed parallel signal processing across a broad bus bandwidth.

The optical backplane of the present invention is also totally immune to EMP (Electro-magnetic Pulse) and EMI (Electromagnetic Interference) effects since it is basically a non-conductive media. Thus, the optical backplane may be used in "electrically noisy" environments where a standard electromagnetic design would be rendered unusable. In addition, if each circuit board present in the optical system is totally shielded such that the only external connections involve the optical transceivers 40, the entire system can be rendered virtually impregnable to EMP effects. Conventional electromagnetic bus structures are affected by impedance mismatches and inter-line capacitance. In contrast, the bandwidth of the optical system is only limited by the speed of light in the optical media and the response time of the optical transceivers and associated driver circuitry.

Another advantage of the circularly shaped conductor 20 is that the signal path length or diameter of conductor 20 increases at a slower rate than the conventional linear backplane. Each time a connector is added in a linear backplane, the path length increases by the spacing between the connectors. In contrast, each time a connector is added to the circularly shaped conductor of the present invention, the path length or diameter increases only by a factor of $1/\pi$ times the connector spacing. The reduced path length also reduces signal delay time between both ends of the bus element. This leads to a ring frequency which is substantially higher and thus decays more rapidly than linear backplane designs.

The circularly shaped optical conductor 20 is the geometry that provides the shortest possible signal path length between each of the printed circuit boards plugged into the edge connectors 30. However, other geometric shapes of conductor 20 are possible depending upon design criteria and limitations. In fact, any geometric shape will work as long as line of sight communication is maintained between transceivers 40 sharing the same conductor 20.

Finally, the mechanical characteristics of the optical backplane also provide great physical utility. Since the printed circuit boards are arranged radially in a cylindrical bus structure, the whole system resembles a finned heat sink that provides for convective cooling. Furthermore, the radial geometry allows for high-profile components, such as relays and transformers, to be mounted on the outer portion of the printed circuit boards. The optical backplane architecture could further be modularized so that individual bus modules comprised of ten optical conductors, for example, could be mounted one on top of the other.

Thus, although the invention has been described relative to specific embodiments thereof, it is not so limited and numerous variations and modification thereof will be readily apparent to those skilled in the art in light of the above teaching. It is therefore to be understood that within the scope of the appended claims the invention may be practiced otherwise than as specifically described.

What is claimed is:

1. An optical backplane for use in high-speed, parallel signal processing between a plurality of printed circuit boards comprising:
    a circularly shaped optical conductor for the transmission of optical data information, said optical conductor having concave sockets formed around the perimeter thereof;
    a plurality of optical transceivers, each optical transceiver being mounted in one of said sockets around the perimeter of said optical conductor, for converting data information received from the printed circuit boards into said optical data information, and for transmitting and receiving said optical data information directly to and from one another via said optical conductor; and
    means for electrically connecting each of said plurality of optical transceivers to one of the plurality of printed circuit boards.

2. An optical backplane as in claim 1 wherein said optical conductor is optically responsive only to the transmission of optical data information from said optical transceivers.

3. An optical backplane as in claim 2 further comprising a plurality of optical conductors.

4. An optical backplane as in claim 1 wherein each of said optical transceivers is within line of sight of one another.

5. An optical backplane for use in high-speed parallel signal processing between a plurality of printed circuit board comprising:
    a circularly shaped optical conductor for the transmission of optical data information, said optical conductor having concave sockets formed around the perimeter thereof and further having first and second planar surfaces impervious to light;
    a plurality of optical transceivers, each optical transceiver being mounted in one of said sockets around the perimeter of said optical conductor, for converting electrical data information received from said printed circuit boards into optical data information, and for transmitting and receiving said optical data information directly to and from one another via said optical conductor; and
    a plurality of circuit card connectors disposed about said perimeter of said optical conductor for electrically connecting said circuit boards to said transceivers.

6. An optical backplane as in claim 5 wherein said first and second planar surfaces are coated with an opaque paint.

7. An optical backplane as in claim 5 wherein said optical transceivers are single element light emitting diodes.

8. An optical backplane as in claim 5 wherein each of said optical transceivers comprises a separate emitter and detector.

9. An optical backplane as in claim 8 wherein said emitter is a light emitting diode.

10. An optical backplane as in claim 8 wherein said emitter and detector are frequency selective.

11. An optical backplane as in claim 8 wherein said emitter and detector are responsive to polarized light.

12. An optical backplane as in claim 5 wherein each of said optical transceivers is within line of sight of one another.

13. An optical backplane as in claim 5 further comprising a plurality of optical conductors.

14. An optical backplane for use in high-speed, parallel signal processing between a plurality of printed circuit boards comprising:
    a plurality of circularly shaped optical conductors for the transmission of optical data information, each of said optical conductors being optically isolated from one another and having concave sockets formed around the perimeter thereof;
    a plurality of optical transceivers, each optical transceiver being mounted in one of said sockets around the perimeter of each of said optical conductors, for converting electrical data information received from said printed circuit boards into said optical data information, and for transmitting and receiving said optical data information directly to and from others of said plurality of optical transceivers mounted around a common optical conductor; and
    a plurality of circuit card connectors disposed about said perimeter of said conductors for electrically connecting said circuit boards to said optical transceivers.

15. An optical backplane as in claim 14 wherein said optical conductors are formed from plexiglass.

16. An optical backplane as in claim 14 wherein said optical conductors are separated from each other by a material impervious to light whereby said optical conductors are optically isolated from one another.

17. An optical backplane as in claim 14 wherein said optical transceivers are light emitting diodes.

18. An optical backplane as in claim 14 wherein said optical transceivers are frequency selective.

19. An optical backplane as in claim 14 wherein said optical transceivers are sensitive to polarized light.

20. An optical backplane as in claim 14 wherein each of said optical transceivers has a separate emitter and detector.

* * * * *